United States Patent [19]
Cheung et al.

[11] Patent Number: 5,785,236
[45] Date of Patent: Jul. 28, 1998

[54] ADVANCED COPPER INTERCONNECT SYSTEM THAT IS COMPATIBLE WITH EXISTING IC WIRE BONDING TECHNOLOGY

[75] Inventors: Robin W. Cheung; Ming-Ren Lin, both of Cupertino, Calif.

[73] Assignee: Advanced Micro Devices, Inc., Sunnyvale, Calif.

[21] Appl. No.: 564,695

[22] Filed: Nov. 29, 1995

[51] Int. Cl.$^6$ .................................................. H01L 21/60
[52] U.S. Cl. ....................... 228/180.5; 228/208; 438/637; 438/688; 29/874
[58] Field of Search ....................... 228/180.5, 208, 228/110.1, 111; 437/209; 29/874, 884, 885; 438/637, 688

[56] References Cited

U.S. PATENT DOCUMENTS

| | | | |
|---|---|---|---|
| 4,735,662 | 4/1988 | Szabo et al. | 437/190 |
| 4,736,236 | 4/1988 | Butt | 357/70 |
| 5,406,120 | 4/1995 | Jones | 257/706 |
| 5,455,195 | 10/1995 | Ramsey et al. | 228/4.5 |
| 5,463,250 | 10/1995 | Nguyen et al. | 257/698 |
| 5,659,201 | 8/1997 | Wollesen | 257/758 |

OTHER PUBLICATIONS

Metals Handbook Ninth Edition, vol. 6, "Solid State Welding, Metallurgical Considerations, Interlayers", 1983.

*Primary Examiner*—Samuel M. Heinrich
*Attorney, Agent, or Firm*—Saywer & Associates

[57] ABSTRACT

A process is provided which enables electrical connection to be formed between gold and aluminum wires and copper interconnects. Conventional techniques for wire bonding are ineffective for bonding gold wires or aluminum wires to copper pads or copper interconnects. A process is provided to modify the copper pads so that conventional wire bonding techniques can be employed. In the process of the present invention an aluminum pad is formed over the copper interconnects. The metal wire is then bonded to the aluminum pad using conventional wire bonding techniques. No new hardware and/or technology is required for the metal wire bonding. No new technology is required to integrate the process of the invention into existing IC fabrication processes.

22 Claims, 2 Drawing Sheets

ADVANCED COPPER INTERCONNECT SYSTEM THAT IS COMPATIBLE WITH EXISTING IC WIRE BONDING TECHNOLOGY

TECHNICAL FIELD

The present invention relates generally to metal interconnects and wire bonding employed in semiconductor technology, and, more particularly, to wire bonding to form electrical connection with copper interconnects which are used for connecting IC (integrated circuit) devices formed in semiconductor wafers.

BACKGROUND ART

The semiconductor industry has been relying on the aluminum-silicon dioxide-based system for the last 30 years. With the ever-increasing demand on performance, however, this system appears to be inadequate to support the future speed and power requirements.

In order to enhance the speed-power product of microprocessor devices, lower RC time constant technology is required. Lower RC time constant technology can be applied to interconnect systems which connect integrated circuit devices formed in semiconductor substrates. To lower the dielectric constant and the resistance of interconnect systems, some technologists have proposed low dielectric constant materials and copper interconnects.

Typical low dielectric constant dielectrics are deposited by either CVD (chemical vapor deposition) or spin-on techniques. Typical low resistance metals are patterned to form interconnects using a damascene metallization process. The damascene metallization technique involves the patterning of trenches in a dielectric layer and the deposition of metal to fill the trenches and form the metal interconnects. This process may require overfilling of the trenches. A polishing or etchback technique is then used to remove any excess metal outside the trenches.

In the formation of copper interconnects using a damascene metallization process, copper will be exposed in the bonding pad area. The bonding pad area is located on the top surface of the integrated circuit structure formed on the semiconductor substrate. The bonding pad area is the region where wires make contact with bonding pads to form electrical connection with the copper interconnects. In this case, where the copper interconnects are exposed in the bonding pad area, the copper is designed to be used as an interconnect and as a bonding pad.

Conventional techniques for wire bonding, however, are not compatible with bonding pads comprising copper. Existing technology employs bonding techniques such as wedge bonding and ultrasonic bonding, etc. These conventional techniques require thermal agitation, that is, rubbing the wire against the bonding pad to form a bond therebetween. The existing technology works for the bonding of either gold wires or aluminum wires to aluminum pads. However, these conventional techniques do not work for the bonding of gold wires or aluminum wires to copper pads, since copper is easily oxidized, forming copper oxide which is an insulator.

A need therefore exists to modify the copper pads so that conventional wire bonding techniques can be employed.

DISCLOSURE OF INVENTION

In accordance with the invention, a process is provided for forming electrical connection between metal wires and metal interconnects which cannot otherwise be bonded to form electrical contact therebetween. These metal wires and the metal interconnects are supported over an integrated circuit structure. The process comprises:

(a) forming at least one of the metal interconnects;

(b) forming an aluminum pad over at least one of the metal interconnects; and (c) bonding one of the metal wires to the aluminum pad.

In the preferred embodiment, the metal interconnects comprise copper interconnects supported in an interlayer dielectric. The interlayer dielectric may comprise oxide, nitride, oxynitride, polymers, or spin-on glass. The interlayer dielectric may comprise dielectics such as CVD oxide, silicon dioxide, fluorinated silicon dioxide, silicon nitride, silicon oxynitride, and benzocyclobutene. The metal wires may comprise gold wires or aluminum wires. The metal interconnects may be formed in the interlayer dielectric by a damascene process. A passivation layer may be formed which surrounds the aluminum pads.

The process of the present invention provides the following benefits:

(1) Conventional wire bonding techniques can be used.

(2) No new technology is required to integrate the process of the invention into existing IC fabrication processes.

(3) No new hardware and/or technology is required for metal wire bonding.

(4) The process of the present invention can be used for interconnect/pad materials other than copper that are also not compatible with existing wire bonding processing.

Other objects, features, and advantages of the present invention will become apparent upon consideration of the following detailed description and accompanying drawings, in which like reference designations represent like features throughout the Figures.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

BEST MODES FOR CARRYING OUT THE INVENTION

Reference is now made in detail to a specific embodiment of the present invention, which illustrates the best mode presently contemplated by the inventors for practicing the invention. Alternative embodiments are also briefly described as applicable.

In accordance with the invention, a process is provided for forming electrical connection between metal wires and metal interconnects which cannot otherwise be bonded to form electrical contact therebetween. These metal wires and the metal interconnects are supported over an integrated circuit structure. The process comprises:

(a) forming at least one of the metal interconnects;

(b) forming an aluminum pad over at least one of the metal interconnects; and

3

(c) bonding one of the metal wires to the aluminum pad.

Figure 1A:
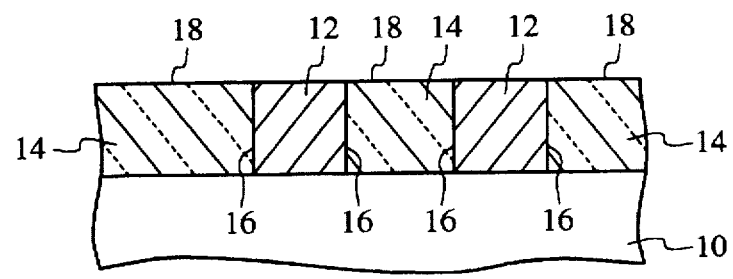
FIGS. 1a–1d are cross-sectional views depicting one embodiment of the process of the invention and the resulting structure; and FIGS: 2a–2d are cross-sectional views depicting an alternative embodiment of the process of the invention and the resulting structure.

Referring now to FIG. 1a, wherein like reference numerals designate like elements throughout, an integrated circuit structure 10 is depicted having metal, e.g., copper, interconnects 12 formed thereon. The integrated circuit structure 10 may comprise a semiconductor substrate having integrated circuit devices formed therein. These integrated circuit devices may include doped regions in the semiconductor substrate separated by field oxide. The integrated circuit structure 10 may additionally include a multilayer interconnect structure formed over the semiconductor substrate connecting the integrated circuit devices. The multilayer interconnect structure may comprise multiple levels of metal interconnects, e.g., copper interconnects, 12. Each level of metal interconnects 12 is supported above the semiconductor substrate by an interlayer dielectric.

The copper interconnects 12 shown in FIG. 1a are formed in an interlayer dielectric 14 formed above the integrated circuit structure 10. While two copper interconnects 12 are shown, it will be readily apparent to those skilled in the art that in fact any number of such copper interconnects are formed in the interlayer dielectric 14. The copper interconnects 12 are formed by a conventional damascene process or by dry etching. The conventional damascene process includes first depositing the interlayer dielectric 14 by conventional means. The interlayer dielectric may comprise oxide, nitride, oxynitride, polymers, or spin-on glass. The interlayer dielectric may comprise dielectics such as CVD oxide, silicon dioxide, fluorinated silicon dioxide, silicon nitride, silicon oxynitride, and benzocylobutene. The interlayer dielectric 14 is typically deposited by chemical vapor deposition or spin-on techniques. The interlayer dielectric 14 is sequentially patterned and etched to form openings or trenches 16 therein. These trenches or trench areas 16 are filled by blanket copper deposition. Polishing is employed to remove the excess copper off of the surface 18 of the interlayer dielectric 14. FIG. 1a shows the integrated circuit structure 10 at this stage of the process.

Figure 1B:
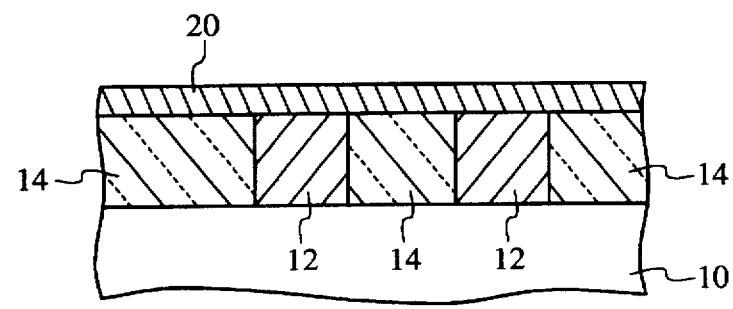
Figure 1C:
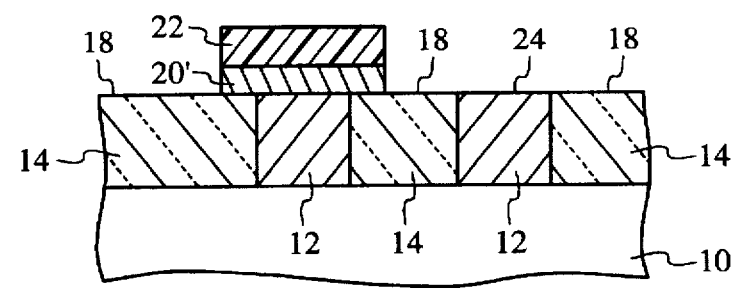

The process flow for the first embodiment of the process of the invention now follows:

A layer of conventional aluminum 20 (shown in FIG. 1b) and an optional barrier metal (not shown) are deposited using conventional processes. The layer of conventional aluminum 20 is formed on the copper interconnects 12 and the interlayer dielectric 14. The layer of conventional aluminum 20 is patterned by masking the layer of conventional aluminum with a negative tone pad mask, i.e., resist pattern 22 shown in FIG. 1c. Reactive ion etching (RIE) is employed to pattern the layer of conventional aluminum 20. The etch will remove all aluminum that is not protected by the resist pattern 22, thus forming at least one aluminum pad 20' such as the aluminum pad shown in FIG 1c. While one such aluminum pad 20' is shown in FIG 1c, it will be readily apparent to those skilled in the art that in fact any number of such aluminum pads are formed. The etch will not attack the exposed copper at the surface 24 of the copper interconnects 12 and the exposed dielectric at the surface 18 of the interlayer dielectric 14.

Figure 1D:
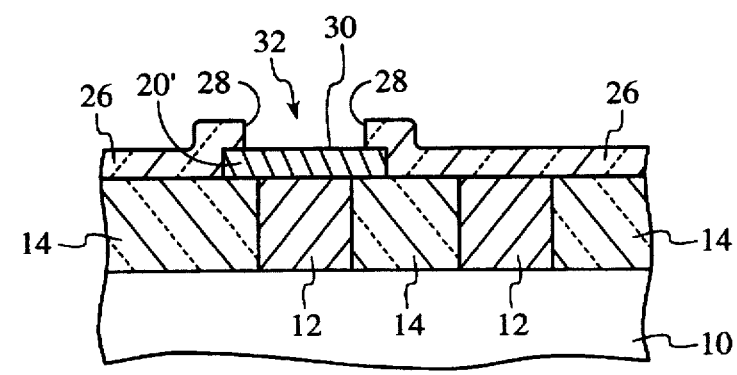

As shown in FIG. 1d, an insulating layer or passivation layer 26 is formed on the aluminum pad 20', the metal interconnects 12 and the interlayer dielectric 14. The passivation layer 26 is patterned and etched to form a bonding pad opening 28 therein as shown in FIG. 1d. The bonding pad opening 28 exposes the surface 30 of the aluminum pad 20'. While one bonding pad opening 28 is shown, it will be readily apparent to those skilled in the art that in fact any number of such bonding pad openings are formed in the passivation layer 26.

4

In this manner, at least one pad opening area 32 is formed such as the pad opening area shown in FIG. 1d. The pad opening area 32 comprises the bonding pad opening 28 and the surface 30 of the aluminum pad 20'. The pad opening area 32 will consist of the same bonding pad opening 28 and same type of surface 30 of the aluminum pad 20' which has been the staple of the IC industry for the last 30 years.

Once the aluminum pad 20' and the bonding pad opening 28 have been formed, conventional techniques can be employed to bond a metal wire to the aluminum pad. $Al_2O_3$ may exist on the surface 30 of the aluminum pad 20'. Conventional bonding techniques easily remove the $Al_2O_3$ on the surface 30 of the aluminum pad 20' and form a good ohmic contact with the metal wire. Typically, gold wires and aluminum wires are employed as the metal wire. The IC may be packaged in a plastic package or in a hermetic package. Typically, gold wires are employed for plastic packages and aluminum wires are employed for hermetic packages.

Figure 2A:
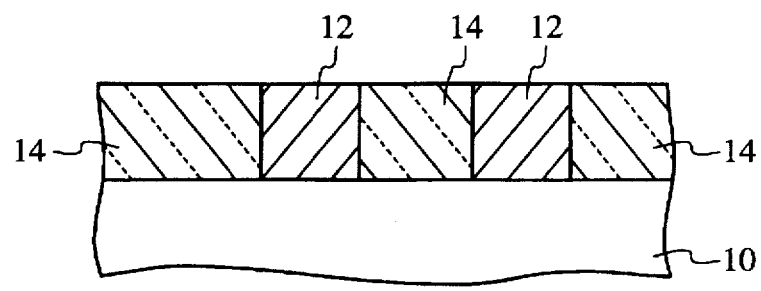

The aluminum pad 20' to be used for wire bonding can also be formed on copper interconnects 12 by employing an alternative embodiment of the process of the present invention. The process flow for the second embodiment of the process of the invention now follows:

In this second embodiment, as in the first embodiment, copper interconnects 12 are formed in an interlayer dielectric 14 by a conventional damascene process that is the same as described above. Alternatively, as in the first embodiment, a copper dry etch process may be used to form the copper interconnects 12. FIG. 2a, which is identical to FIG. 1a (with some callouts not included), shows the integrated circuit structure 10 at this stage of the process. Again, while two copper interconnects 12 are shown, it will be readily apparent to those skilled in the art that in fact any number of such copper interconnects are formed in the interlayer dielectric 14.

Figure 2B:
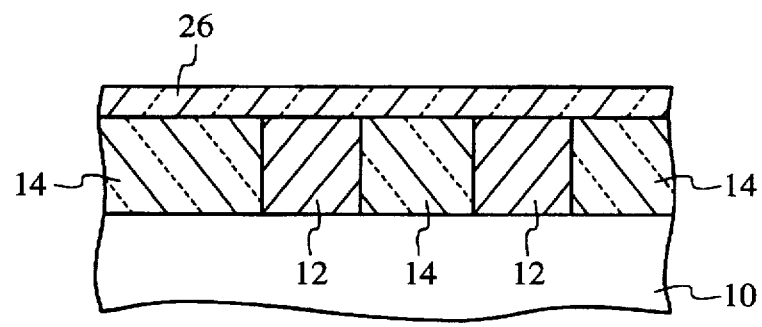
Figure 2C:
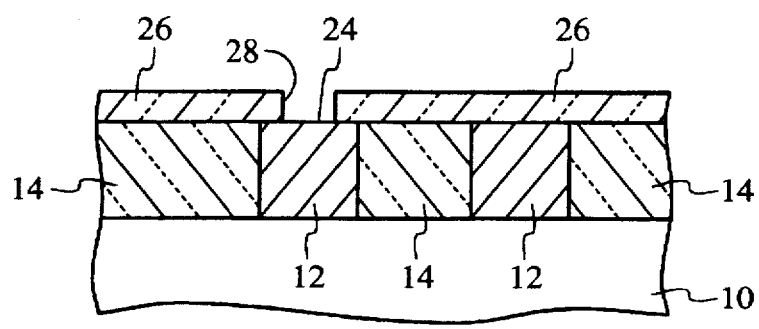

As shown in FIG. 2b, an insulating layer or passivation layer 26 is formed on the copper interconnects 12 and the interlayer dielectric 14. The passivation layer 26 is patterned and etched to form a opening 28 (which may be termed a bonding pad opening) therein as shown in FIG. 2c. The opening 28 exposes the surface 24 of the copper interconnect 12. While one such opening 28 is shown in FIG. 2c, it will be readily apparent to those skilled in the art that in fact any number of such openings are formed. The passivation layer 26 and the opening 28 are conventional and are formed by conventional processes.

A layer of conventional aluminum 20 (not shown) and an optional barrier metal (also not shown) are blanket deposited, also using conventional processes. The layer of conventional aluminum 20 is formed on the passivation layer 26 and fills the opening 28 therein. The layer of conventional aluminum 20 is patterned to form an aluminum pad 20'. Lift-off techniques or conventional mask and etch techniques, such as those used in the first embodiment and described above, can be used to pattern the layer of conventional aluminum 20.

Figure 2D:
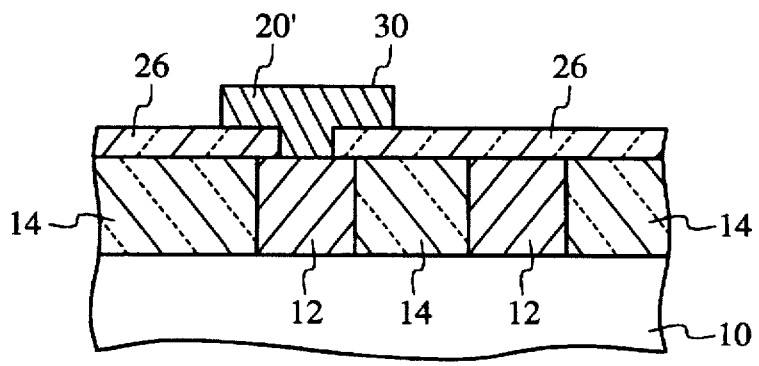

In this manner, at least one aluminum pad 20' is formed, such as the aluminum pad shown in FIG. 2d. While one such aluminum pad 20' is shown in FIG. 2d, it will be readily apparent to those skilled in the art that in fact any number of such aluminum pads are formed.

An optional second insulating layer or second passivation layer and bonding pad opening 28, similar to the passivation layer 26 and bonding pad opening 28 shown in FIG. 1d, can be formed over the aluminum pad 20'. To form the optional second passivation layer and bonding pad opening 28, the optional second passivation layer is deposited on the aluminum pad 20' and the passivation layer 26 shown in FIG. 2d. The optional second passivation layer is patterned and etched to form a bonding pad opening 28 therein above the aluminum pad 20'.

A metal wire is bonded to the aluminum pad 20'. Conventional techniques can be employed to bond the metal wire to the aluminum pad 20'. As described above, $Al_2O_3$ may exist on the surface 30 of the aluminum pad 20'. Conventional bonding techniques easily remove the $Al_2O_3$ on the surface 30 of the aluminum pad 20' and form a good ohmic contact with the metal wire. As described above, typically gold wires and aluminum wires are employed as the metal wire. Also, as described above, the IC may be packaged in a plastic package or in a hermetic package. Gold wires are employed for plastic packages and aluminum wires are employed for hermetic packages.

The process of the present invention provides the following benefits:

(1) The bonding structure, which comprises the metal wire bonded to the aluminum pad 20', is identical to the bonding structures employed in existing technology. Accordingly, conventional wire bonding techniques can be used.

(2) No new technology is involved in the process of the invention thus no new technology is required to integrate the process of the invention into existing IC fabrication processes.

(3) No new hardware and/or technology is required for metal wire bonding.

(4) The process of the present invention can be used for interconnect/pad materials other than copper that are also not compatible with existing wire bonding processing.

INDUSTRIAL APPLICABILITY

The process of the invention for forming electrical connection between gold and aluminum wires and copper interconnects is expected to find use in the fabrication of silicon-based devices and may be applied to MOS and bipolar technologies.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. Many variations of films and materials are possible. It is possible that the invention may be practiced in other fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

what is claimed is:

1. A process for forming electrical connection between metal wires and metal interconnects which cannot otherwise be bonded to form electrical contact therebetween, said metal wires and said metal interconnects supported over an integrated circuit structure, said metal interconnects supported in an interlayer dielectric, said process comprising:

(a) forming at least one of said metal interconnects within said interlayer dielectric;

(b) depositing a layer of aluminum on said metal interconnects and said interlayer dielectric;

(c) patterning and etching said layer of aluminum to form an aluminum pad;

(d) depositing an insulating layer over said aluminum pad, said metal interconnects, and said interlayer dielectric;

(e) patterning and etching said insulating layer to form a bonding pad opening in said insulating layer above said aluminum pad; and (f) bonding one of said metal wires to said aluminum pad.

2. The process of claim 1 wherein said metal interconnects comprise copper interconnects.

3. The process of claim 1 wherein said metal wires are selected from the group of wires consisting of gold wires and aluminum wires.

4. The process of claim 1 wherein said metal interconnects are supported in an interlayer dielectric.

5. The process of claim 4 wherein said interlayer dielectric comprise dielectrics selected from the group consisting of oxide, nitride, oxynitride, polymers, and spin-on glass.

6. The process of claim 5 wherein said interlayer dielectric comprise dielectrics selected from the group consisting of CVD oxide, silicon dioxide, fluorinated silicon dioxide, silicon nitride, silicon oxynitride, and benzocylobutene.

7. The process of claim 5 wherein said interlayer dielectric is deposited by chemical vapor deposition or spin-on techniques.

8. The process of claim 4 wherein said metal interconnects are formed in said interlayer dielectric by a process comprising:

(a) depositing said interlayer dielectric;

(b) patterning and etching said interlayer dielectric to form trenches therein;

(c) blanket depositing a layer of metal over said interlayer dielectric to fill said trenches; and (d) polishing or etching said layer of metal at least down to said interlayer dielectric to remove said excess metal outside of said trenches.

9. The process of claim 1 wherein a second insulating layer is formed which surrounds said aluminum pad by a process comprising:

(a) depositing said second insulating layer over said aluminum pad and said first insulating layer; and (b) patterning and etching said second insulating layer to form a bonding pad opening in said first insulating layer above said aluminum pad.

10. The process of claim 1 wherein said integrated circuit structure comprises said integrated circuit devices formed in a semiconductor substrate, said integrated circuit devices including doped regions in said semiconductor substrate separated by field oxide.

11. The process of claim 10 wherein said integrated circuit structure includes multilayer interconnects comprising multiple levels of metal interconnects, each level of said metal interconnects supported by a separate said interlayer dielectric.

12. A process for forming electrical connection between metal wires and metal interconnects which cannot otherwise be bonded to form electrical contact therebetween, said metal wires and said metal interconnects supported over an integrated circuit structure, said metal interconnects supported in an interlayer dielectric, said process comprising:

(a) forming at least one of said metal interconnects within said interlayer dielectric;

(b) depositing a first insulating layer on said metal interconnects and said interlayer dielectric;

(c) patterning and etching said first insulating layer to form openings is said first insulating layer;

(d) blanket depositing a layer of aluminum on said first insulating layer and said openings in said first insulating layer;

(e) patterning and etching said layer of aluminum to form an aluminum pad; and (f) bonding one of said metal wires to said aluminum pad.

13. The process of claim 12 wherein a second insulating layer is formed which surrounds said aluminum pad by a process comprising:

(a) depositing said second insulating layer over said aluminum pad and said first insulating layer; and (b) patterning and etching said second insulating layer to form a bonding pad opening in said first insulating layer above said aluminum pad.

14. The process of claim 12 wherein said metal interconnects comprise copper interconnects.

15. The process of claim 12 wherein said metal wires are selected from the group of wires consisting of gold wires and aluminum wires.

16. The process of claim 12 wherein said metal interconnects are supported in an interlayer dielectric.

17. The process of claim 16 wherein said interlayer dielectric comprise dielectrics selected from the group consisting of oxide, nitride, oxynitride, polymers, and spin-on glass.

18. The process of claim 17 wherein said interlayer dielectric comprise dielectrics selected from the group consisting of CVD oxide, silicon dioxide, fluorinated silicon dioxide, silicon nitride, silicon oxynitride, and benzocyclobutene.

19. The process of claim 17 wherein said interlayer dielectric is deposited by chemical vapor deposition or spin-on techniques.

20. The process of claim 16 wherein said metal interconnects are formed in said interlayer dielectric by a process comprising:

(a) depositing said interlayer dielectric;

(b) patterning and etching said interlayer dielectric to form trenches therein;

(c) blanket depositing a layer of metal over said interlayer dielectric to fill said trenches; and (d) polishing or etching said layer of metal at least down to said interlayer dielectric to remove said excess metal outside of said trenches.

21. The process of claim 12 wherein said integrated circuit structure comprises said integrated circuit devices formed in a semiconductor substrate, said integrated circuit devices including doped regions in said semiconductor substrate separated by field oxide.

22. The process of claim 21 wherein said integrated circuit structure includes multilayer interconnects comprising multiple levels of metal interconnects, each level of said metal interconnects supported by a separate said interlayer dielectric.

* * * * *